United States Patent
Mohammadi

(10) Patent No.: US 11,483,656 B1
(45) Date of Patent: Oct. 25, 2022

(54) DIGITAL MICROPHONE ASSEMBLY WITH REDUCED POWER CONSUMPTION

(71) Applicant: Knowles Electronics, LLC, Itasca, IL (US)

(72) Inventor: Mohammad Sadegh Mohammadi, Lyngby (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/366,781

(22) Filed: Jul. 2, 2021

(51) Int. Cl.
*H04R 3/02* (2006.01)
*H04R 1/04* (2006.01)
*B81B 3/00* (2006.01)

(52) U.S. Cl.
CPC ............. *H04R 3/02* (2013.01); *B81B 3/0021* (2013.01); *H04R 1/04* (2013.01); *B81B 2201/0257* (2013.01); *H04R 2201/003* (2013.01)

(58) Field of Classification Search
None
See application file for complete search history.

(56) References Cited

U.S. PATENT DOCUMENTS

| 2019/0387326 | A1 | 12/2019 | Hansen et al. | |
|---|---|---|---|---|
| 2020/0010315 | A1 | 1/2020 | Tingleff et al. | |
| 2021/0258014 | A1* | 8/2021 | Tang | H03M 1/46 |
| 2022/0209789 | A1* | 6/2022 | Mohammadi | H04R 3/02 |

OTHER PUBLICATIONS

Mohammadi et al., U.S. Appl. No. 17/096,499, "Sensor Assembly and Electrical Circuit Therefor", U.S. Patent and Trademark Office, filed Nov. 12, 2020.
Pedersen et al., U.S. Appl. No. 16/874,503, "Capacitive Sensor Assembly and Electrical Circuit Therefor", U.S. Patent and Trademark Office, filed May 14, 2020.
Mohammadi et al., U.S. Appl. No. 17/139,743, "Digital Microphone Assembly with Improved Mismatch Shaping", U.S. Patent and Trademark Office, filed Dec. 31, 2020.
Mohammadi et al., U.S. Appl. No. 17/197,026, "Digital Sensor Assembly with Selective Dynamic Element Matching", U.S. Patent and Trademark Office, filed Mar. 10, 2021.

* cited by examiner

*Primary Examiner* — Kenny H Truong
(74) *Attorney, Agent, or Firm* — Loppnow & Chapa; Roland K. Bowler, II

(57) ABSTRACT

The present disclosure relates generally to digital microphone and other sensor assemblies including a transduction element and a successive-approximation (SA) quantizer configured to reuse a digital code generated for a prior sample period for a current sample period when a reuse condition is satisfied. The SA quantizer does not regenerate a new digital code for the current sample period when the digital code generated for the prior sample period is used thereby reducing power consumption.

20 Claims, 4 Drawing Sheets

DIGITAL MICROPHONE ASSEMBLY WITH REDUCED POWER CONSUMPTION

FIELD OF THE DISCLOSURE

The present disclosure relates generally to digital microphone and other sensor assemblies and more particularly to digital sensor assemblies comprising a successive-approximation (SA) quantizer, SA quantizers for such sensor assemblies, and methods therein.

BACKGROUND

Digital microphones having a transduction element, like a micro electro mechanical systems (MEMS) motor, that converts sound into an electrical signal conditioned or processed by an integrated circuit are known generally and used in cell phones, personal computers, smart speakers and internet of things (IoT) applications among other host devices and systems. Digital microphones and other sensors often comprise an analog-to-digital converter (ADC) having a successive-approximation (SA) quantizer that generates digital codes representative of sampled analog input signals during successive sampling periods. More specifically, for each sampled input signal the quantizer generates a corresponding multi-bit digital code that is output to a successive-approximation register (SAR) based on a search of quantization levels using successive-approximation logic, a switched-capacitive digital-to-analog converter (SC-DAC) and a comparator of the quantizer. However, these and other elements of the quantizer contribute significantly to power consumption of the digital sensor assembly.

BRIEF DESCRIPTION OF THE DRAWINGS

The objects, features and advantages of the present disclosure will become more fully apparent from the following detailed description and the appended claims considered in conjunction with the accompanying drawings. The drawings depict only representative embodiments and are therefore not considered to limit the scope of the disclosure.

Those of ordinary skill in the art will appreciate that the drawings are illustrated for simplicity and clarity and therefore may not be drawn to scale and may not include well-known features, that the order of occurrence of actions or steps may be different than the order described or some actions or steps may be performed concurrently unless specified otherwise, and that the terms and expressions used herein have the meaning understood by those of ordinary skill in the art except where different meanings are attributed to them herein.

DETAILED DESCRIPTION

The present disclosure relates generally to digital microphone and other digital sensor assemblies comprising a transduction element and a successive-approximation (SA) quantizer having reduced power consumption, SA quantizers for such sensor assemblies, and methods of operation of digital sensor assemblies and SA quantizers therefor.

Figure 1:
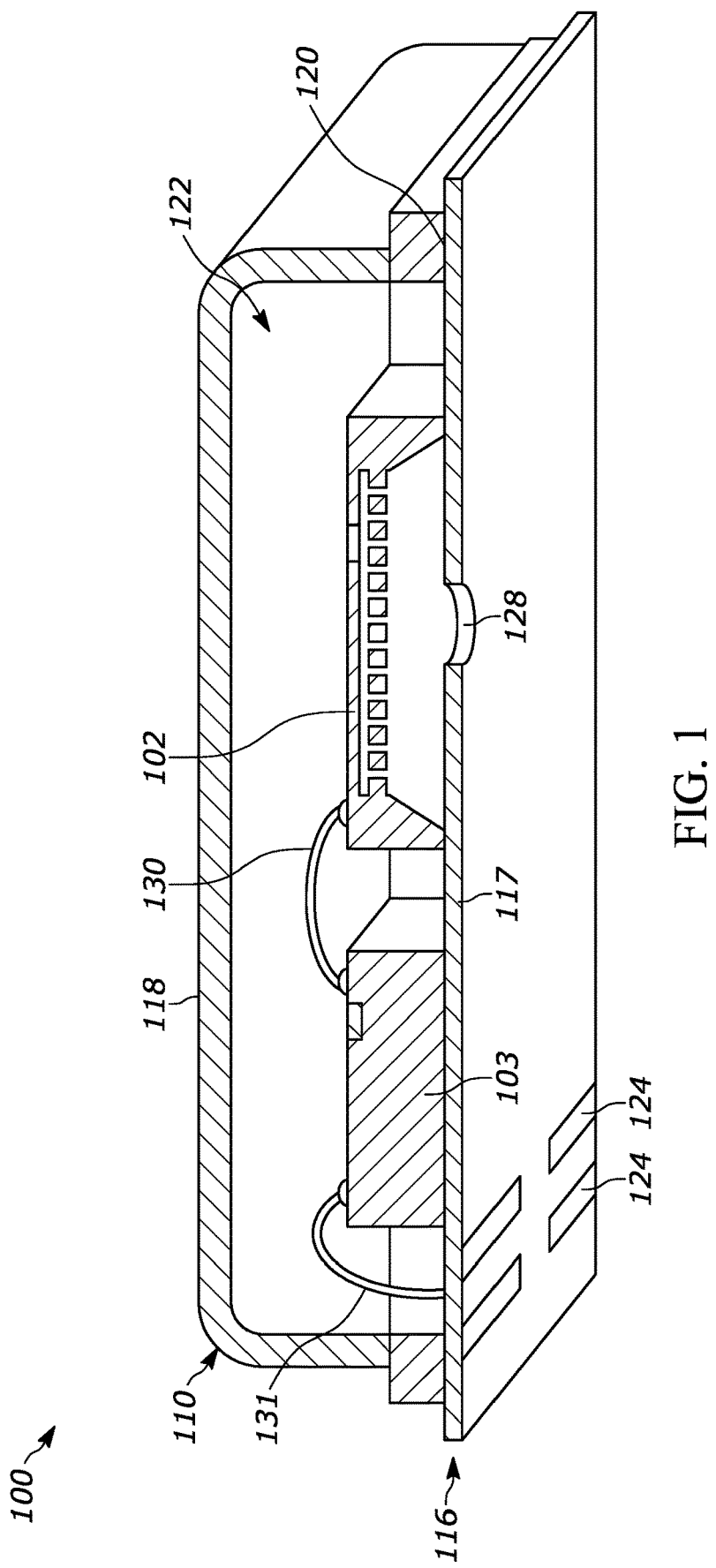
FIG. 1 is a cross-sectional view of a sensor assembly.

The digital sensor assembly generally comprises a transduction element and a SA quantizer constituting an electrical circuit implemented as one or more integrated circuits (ICs), for example an ASIC. FIG. 1 is a cross-sectional view of a sensor assembly 100 comprising a transduction element 102 coupled to an electrical circuit 103 disposed within a housing 110. The housing includes a base 116 and a cover 118 fastened to an upper surface 120 of the base. In some implementations, the housing shields the transduction element and the electrical circuit located within the interior 122 of the housing from electromagnetic interference, like RF noise. For this purpose, the cover can be a metal can. Alternatively, the cover can be a non-conductive material like plastic or FR4 comprising a conductive film or other conductive layer electrically coupled to a conductive portion (e.g., a ground plane) of the base. The housing can also include an electrical interface with contacts (e.g., supply, ground, data, clock, select, etc.) configured to interface with a host device. The host interface can be configured for reflow soldering, through-hole mounting, or wire-bonding, among other known and future integration processes. In FIG. 1, the digital sensor assembly is a surface-mount device comprising a host-interface including electrical contacts 124 (e.g., ground, power, data, clock, select . . . ) located on an outer surface 117 of the base 116. The electrical circuit 103, including the SA quantizer, is coupled to the transducer 102 via lead 130 and to contacts on the host-interface via lead 131 electrically connected to traces (not shown) in the base for this purpose. The electrical circuit can obtain power, clock and other signals from the contacts on the host-interface.

In some digital sensor assemblies, like microphones, the housing includes an aperture (also called a "sound port" or "port" herein) connecting the interior of the housing to the external environment. In FIG. 1, the port 128 is located on the base 116 in alignment with the transducer 102. In other sensors, the port can be on some other part of the housing, like the cover or a side portion thereof. For example, in top-port microphone assemblies, the sound port is located on the cover. The sound port is not required in other sensor assemblies, like acoustic vibration sensors and accelerometers, among others.

In one embodiment, the sensor assembly is a microphone configured to generate an electrical signal representative of acoustic signals propagated through the atmosphere and detected by the transduction element within the housing. In other embodiments, the sensor assembly is configured to generate an electrical signal representative of vibrations or forces detected by the sensor assembly. For example, the sensor assembly can be configured to detect acoustic vibrations propagated through a person's body or an inanimate object alone or in addition to the detection of acoustic signals propagated through the air. Other digital sensor assemblies can be configured to detect pressure, acceleration, humidity, or temperature, among other conditions. The transducer can be a capacitive, piezoelectric, optical or some other transduction element. These and other transduction elements can be implemented as a microelectromechanical systems (MEMS) device, electrets or as some other known or future device.

Generally, the SA quantizer converts samples of an analog signal into corresponding discrete digital representations by performing a search of quantization levels that converge on a digital code representative of each sample. The resulting digital code generated for each sample is stored in a successive-approximation register (SAR) during the corresponding sample period. The digital code can be provided to the host-interface for communication with a host device. In some implementations, the digital code is further processed by the electrical circuit prior to output at the host-interface. For example, such further optional processing includes converting the signal to a particular protocol format, like PDM or SoundWire, among other known and future formats.

The sampled signal input to the SA quantizer can be based on an analog signal generated by a transduction element or from some other source. In the process flow diagram of FIG. 2, at 210, the SA quantizer obtains a current sample based on an analog electrical signal generated by a transduction element of a digital sensor assembly. More generally, the analog signal can be obtained from any other source. The analog signal is sampled during each sample period. Sampling can be performed by a sample-and-hold or other circuit. The analog signal can be processed prior to sampling. Such optional processing can include buffering, filtering, amplification among other signal processing, depending on the source of the analog signal and the particular use case requirements.

Figure 2:
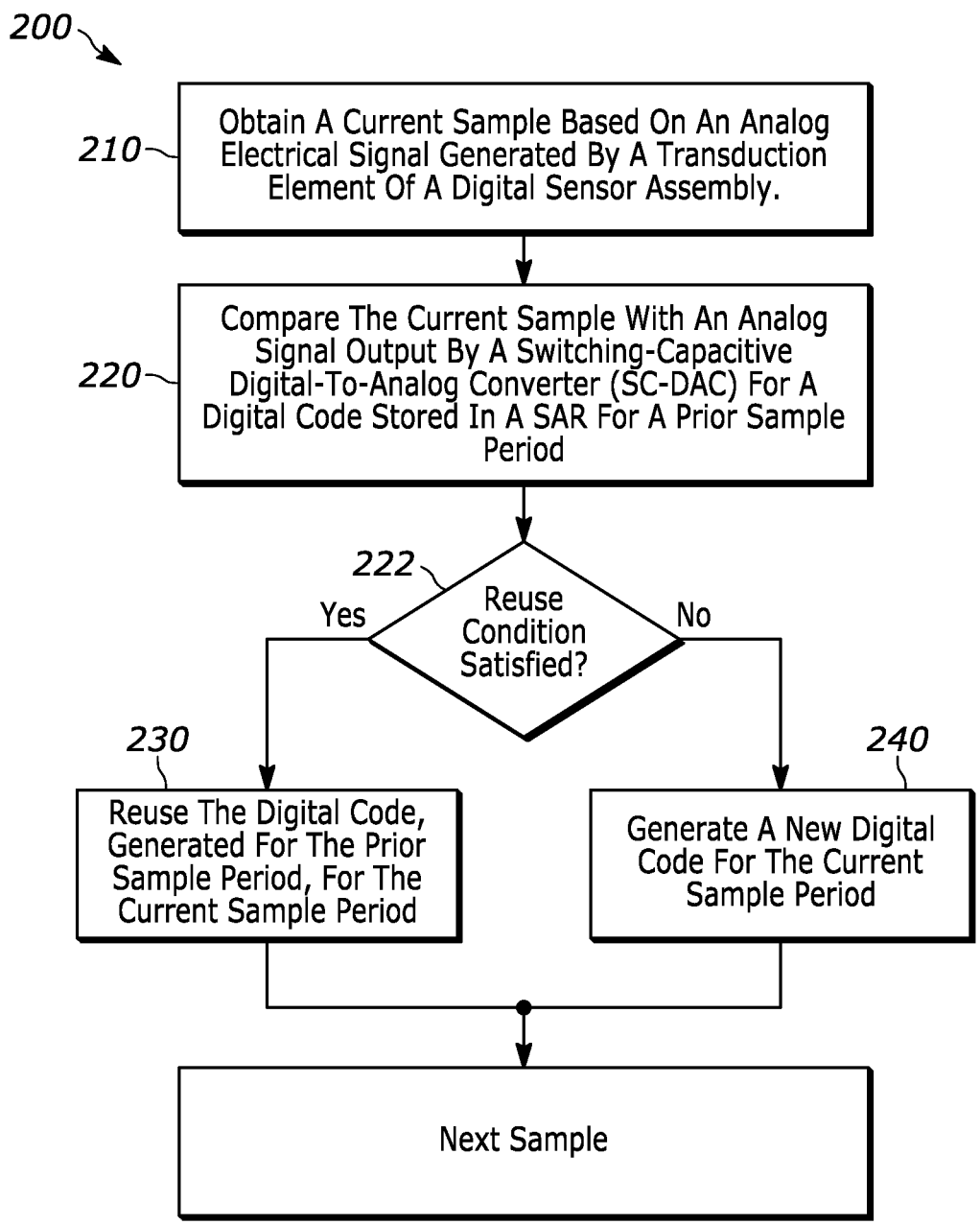
FIG. 2 is a representative process block flow diagram implemented in a successive-approximation (SA) quantizer or in a digital sensor assembly having a SA quantizer.
Figure 3:
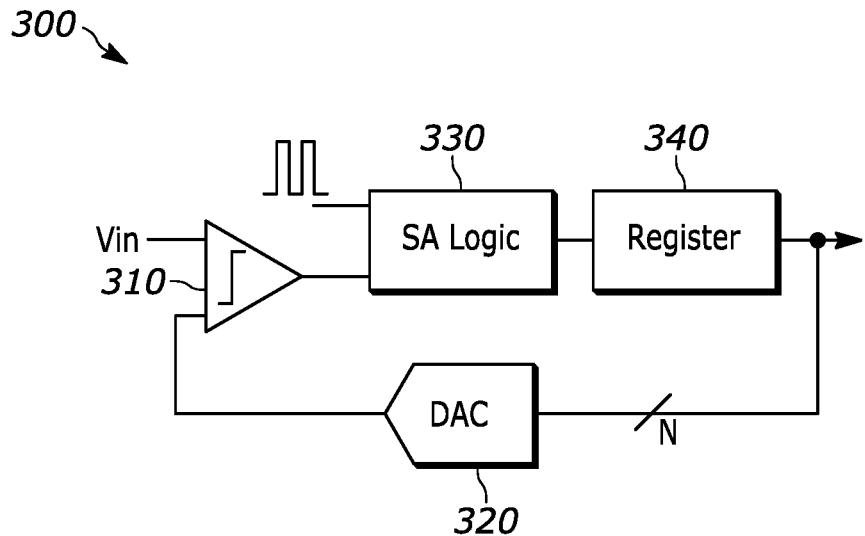
FIG. 3 is a schematic block diagram representation of a SA quantizer.

In FIG. 3, the SA quantizer 300 comprises a comparator 310 coupled to successive-approximation (SA) logic 330 having a clock signal input, a switching-capacitive digital-to-analog converter (SC-DAC) 320 in a feedback loop, and a successive-approximation register (SAR) 340. The comparator is configured and controlled to compare each sample to an analog feedback signal from the SC-DAC. Thus in the process flow diagram of FIG. 2, at 220, the SA quantizer compares a sample with an analog signal output by the SC-DAC during each sample period.

During each sample period, the SA quantizer is configured and controlled to search for a digital code corresponding to each sample using an algorithm that searches quantization levels for each bit of the sampled signal, usually beginning with the most significant bit (MSB). The search algorithm can implement a variety of schemes. A binary search is common, but a linear search or hashing scheme among others can also be used. The digital code generated for each sample is stored in the SAR for output to the host-interface. The SA quantizer can be reset prior to searching for the sample obtained during the next sample period. As suggested, generating a digital code can consume substantial power, some of which is attributable to discharging and charging capacitors of the SC-DAC and comparator, and the operation of other elements of the SA quantizer.

According to one aspect of the disclosure, the SA quantizer is configured to reuse a digital code, generated and stored in the SAR for a prior sample period, for a current sample period when a reuse condition is satisfied. In the process flow diagram of FIG. 2, at decision block 222, the SA quantizer determines whether the reuse condition is satisfied. In FIG. 2, at block 230, the SA quantizer reuses a digital code generated for a prior sample period when the reuse condition is satisfied.

Figure 4:
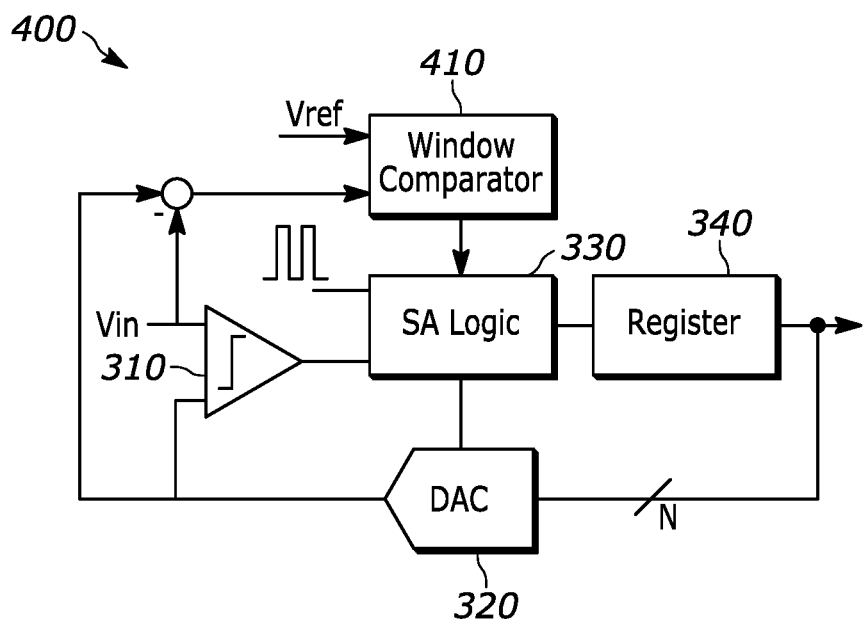
FIG. 4 is a schematic block diagram representation of a SA quantizer with additional window-comparator.

The reuse condition can be based on whether a difference between a current sample and an analog output of a SC-DAC for the digital code previously generated and stored in the SAR for the prior sample is more or less than a reference. The SA logic can configure the SA quantizer to compare a difference between the current sample and the analog signal output by the SC-DAC to a reference. In one implementation the reuse condition is satisfied when the difference is less than a fraction of a least significant bit (LSB) of the sampled signal. In a more particular implementation, the samples are voltages and the reference is a voltage corresponding to ½ the LSB. In SA quantizer architectures based on a window comparator, the comparison of the difference to the reference can be performed by the comparator 310 in FIG. 3. In other SA quantizer architectures, an additional window-comparator may be required to perform the comparison. In the SA quantizer 400 of FIG. 4, the difference between the analog output of the SC-DAC and analog input signal $V_{IN}$ are compared to a reference $V_{REF}$ by a window comparator 410 having an input to the SA logic. Other elements of the SA quantizer in FIG. 4 and the corresponding functions are as described herein in connection with the SA quantizer of FIG. 3.

According to a related aspect of the disclosure, power consumption can be reduced by not searching for a new digital code for a current sample period when the digital code for a prior sample period is reused. Thus in FIG. 2, at block 230, the SA quantizer reuses a digital code generated for the prior sample period without searching for a new digital code. Bypassing the search procedure reduces power consumption of various components of the SA quantizer, including the comparator and SC-DAC, among others. Thus, a digital code generated and stored in the SAR for a prior sample period can be reused for the current sample period, assuming that the reuse condition is satisfied, without the resulting power consumption associated with generating a new digital code. In the process flow diagram of FIG. 2, at block 240, the SA quantizer generates a new digital code for the current sample period when the reuse condition is not satisfied at decision block 222.

The inventor recognized that digital codes generated by the SA quantizer are repeated more or less depending on the application or use case and that such repetition is particularly frequent for applications wherein the frequency band is relatively narrow. In Table I below, simulation data shows that digital codes generated by an SA quantizer for audio band signals have a repetition rate of thirty percent (30%) or more and that these repetition rates are relatively consistent at various input sound pressure levels (SPLs) and across the audio band. Thus, significant power savings can be attained by reusing previously generated digital codes instead of generating new digital codes in at least some applications where reuse criteria is satisfied.

TABLE I

| Input Signal to the Microphone | Quantizer Code Repetition Ratio |
| --- | --- |
| 71 dBSPL at 440 Hz | 31.4520% |
| 91 dBSPL at 440 Hz | 34.1557% |
| 111 dBSPL at 440 Hz | 33.9430% |
| Low frequency content Music 20 dB attenuated | 31.3054% |
| Low frequency content Music | 31.9755% |
| Low frequency content Music 20 dB amplified | 33.8469% |
| High Frequency Music 20 dB attenuated | 31.2205% |
| High Frequency Music | 31.8627% |
| High Frequency Music 20 dB amplified | 33.8493% |
| Voice 20 dB attenuated | 30.9714% |
| Voice 20 dB attenuated | 31.3760% |
| Voice 20 dB amplified | 32.7244% |
| 2 dBSPL(A) White noise BW 3-8 Hz | 30.8401% |
| −22 dBSPL(A) White noise BW 3-8 Hz | 30.9698% |
| −42 dBSPL(A) White noise BW 3-8 Hz | 31.5232% |
| 71 dBSPL@26 KHz | 31.4226% |
| 91 dBSPL@26 KHz | 33.1974% |
| 111 dBSPL@26 KHz | 33.1860% |

TABLE I-continued

| Input Signal to the Microphone | Quantizer Code Repetition Ratio |
|---|---|
| 71 dBSPL at 26 KHz burst at 1 Hz | 31.4315% |
| 91 dBSPL at 26 KHz burst at 1 Hz | 34.1386% |
| 111 dBSPL at 26 KHz burst at 1 Hz | 32.5535% |
| No input (silent) | 30.8223% |

Figure 5:
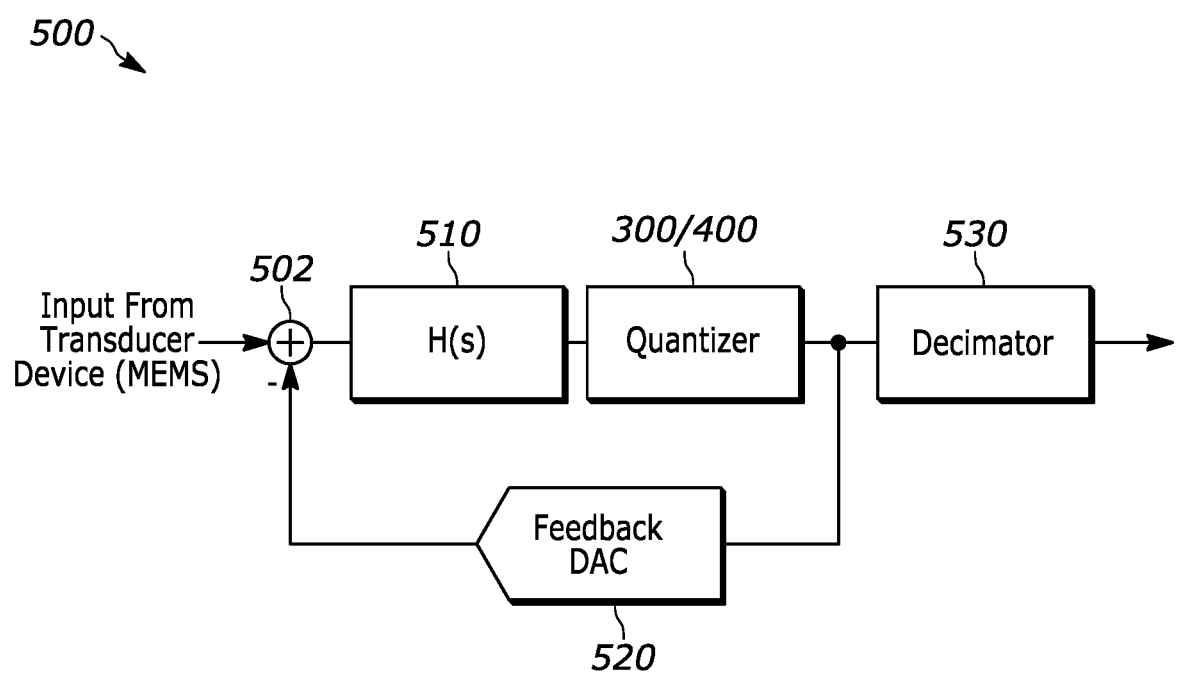
FIG. 5 is a schematic block diagram representation of a delta-sigma analog-to-digital converter (ADC) including a SA quantizer.

The SA quantizer described herein can be used as a stand-alone analog-to-digital converter (ADC). Alternatively, the quantizer can be integrated with a delta-sigma ADC. In FIG. 5, the SA quantizer is integrated with a delta-sigma ADC 500 comprising integrator stages 510 coupled to the SA quantizer and configured to implement a transfer function H(s). Delta-sigma ADCs are often used in microphones and other sensor assemblies, among other applications. The SA quantizer can be of the type shown in FIG. 3 or in FIG. 4, among others. In FIG. 5, DAC 520 is coupled to the output of the SA quantizer and configured to generate a feedback signal based on the digital code from the SAR. A summer circuit 502 sums the analog signal from the DAC with the analog signal from the transduction element.

In some embodiments, the electrical circuit can optionally include one or more analog signal conditioning circuits upstream of the delta-sigma ADC as described herein. Such signal conditioning circuits can comprise a low noise amplifier, buffer, filter or some combination of these and other signal conditioning circuits. The electrical circuit can also optionally include a digital signal conditioning circuit downstream of the SA quantizer. In FIG. 5 for example the delta-sigma ADC performs noise shaping at a relatively high sampling rate, and a decimator 530 located downstream of the SA quantizer downconverts the digital signal prior to output or further processing. In microphone implementations, the digital conditioning circuit can format the digital signal for a particular digital protocol like PDM or Soundwire, among others. Alternatively, the electrical circuit can output a PCM format signal at the output terminal. Generally, the electrical circuit can include other circuit elements upstream and downstream of the SA quantizer, depending on the nature of the host device and the application requirements.

Thus, the disclosure relates generally to electrical circuits for converting analog electrical signals to digital signals. The electrical circuit can be implemented as one or more ICs, for example, as an ASIC, or as a non-integrated circuit. The electrical circuit generally comprises a successive-approximation (SA) quantizer electrically connectable to a transduction element of the digital sensor assembly or to another analog signal source. The SA quantizer comprises a comparator having inputs coupled to an output of a switched-capacitive digital-to-analog converter (SC-DAC), SA logic coupled to an output of the comparator and to the SC-DAC, and a successive-approximation register (SAR) coupled to the SA logic and to the SC-DAC, wherein the SA quantizer outputs a digital code, stored in the SAR for a prior sample period (when the SA quantizer is coupled to the analog signal source) for a current sample period when a reuse condition is satisfied. The SA quantizer can be configured to search for a new digital code for the current sample period when the reuse condition is not satisfied, and not search for the new digital code for the current sample period when the reuse condition is satisfied. In one implementation, the SA quantizer is implemented in a delta-sigma ADC. Such SA quantizer circuits can be used in digital microphones and other sensor assemblies, examples of which are described herein. Thus, the SA quantizer can be used in combination with a transduction element like a micro electro mechanical systems (MEMS) motor configured to sense acoustic signals. More generally the SA quantizer can be used to digitize any analog signal, with or without a delta-sigma modulator.

In one implementation, a digital sensor assembly comprises a transduction element disposed in a housing and configured to generate an analog electrical signal in response to a sensed condition, and a successive-approximation (SA) quantizer disposed in the housing and electrically coupled to the transduction element and to a host-interface of the housing. The SA quantizer comprises a comparator having inputs coupled to the transduction element and to an output of a switched-capacitive digital-to-analog converter (SC-DAC), SA logic coupled to an output of the comparator and to the SC-DAC, and a successive-approximation register (SAR) coupled to the SA logic and to the SC-DAC, wherein the SA quantizer is configured to reuse a digital code, stored in the SAR for a prior sample period, for a current sample period based on a difference between a current sample of the analog electrical signal and an analog output of the SC-DAC for the digital code stored in the SAR for the prior sample period.

The SA quantizer can be configured not to search for a new digital code for the current sample period when the digital code stored in the SAR for the prior sample period is reused for the current sample period. The SA quantizer is configured to search for a new digital code for the current sample period when the digital code stored in the SAR for the prior sample period is not reused for the current sample period, wherein the SA quantizer searches for the new digital code using the SA logic, the SC-DAC and the comparator.

In one representative example, the sensor assembly is an acoustic microphone assembly and the transduction element can be a micro electro mechanical systems (MEMS) motor configured to sense audio band signals. The housing of the microphone assembly can include a sound port acoustically coupling the transduction element to an exterior of the housing, and the SA quantizer can be part of a delta-sigma analog-to-digital converter (ADC).

While the disclosure and what is presently considered to be the best mode thereof has been described in a manner establishing possession and enabling those of ordinary skill in the art to make and use the same, it will be understood and appreciated that there are many equivalents to the select embodiments described herein and that myriad modifications and variations may be made thereto without departing from the scope and spirit of the invention, which is to be limited not by the embodiments described herein but by the appended claims and their equivalents.

What is claimed is:

1. A digital sensor assembly comprising:
   a housing having a host-device interface;
   a transduction element disposed in the housing and configured to generate an analog electrical signal in response to a sensed condition;
   a successive-approximation (SA) quantizer disposed in the housing and electrically coupled to the transduction element and to the host device interface, the SA quantizer including:
   a comparator having inputs coupled to the transduction element and to an output of a switched-capacitive digital-to-analog converter (SC-DAC);
   SA logic coupled to an output of the comparator and to the SC-DAC; and a successive-approximation register (SAR) coupled to the SA logic and to the SC-DAC;

the SA quantizer configured to reuse a digital code, stored in the SAR for a prior sample period, for a current sample period based on a difference between a current sample of the analog electrical signal and an analog output of the SC-DAC for the digital code stored in the SAR for the prior sample period.

2. The assembly of claim 1, wherein the current sample is a voltage and the SA quantizer is configured to compare the difference to a reference voltage representative of at least a fraction of a least significant bit.

3. The assembly of claim 2, wherein the SA quantizer is configured not to search for a new digital code for the current sample period when the digital code stored in the SAR for the prior sample period is reused for the current sample period.

4. The assembly of claim 3 is an acoustic microphone assembly and the transduction element is a micro electro mechanical systems (MEMS) motor configured to sense audio band signals.

5. The assembly of claim 1, wherein the SA quantizer is configured to:
search for a new digital code for the current sample period when the difference is greater than a reference; and
not search for the new digital code for the current sample period when the difference is less than the reference.

6. The assembly of claim 5, wherein the SA quantizer is configured to search for the new digital code by searching quantization levels using the SA logic, the SC-DAC and the comparator of the SA quantizer.

7. The assembly of claim 6 is a microphone assembly, the housing includes a sound port, the transduction element is a micro-electro mechanical systems (MEMS) motor acoustically coupled to an exterior of the housing via the sound port, and the SA quantizer is part of a delta-sigma analog-to-digital converter (ADC), wherein the analog electrical signal is representative of an acoustic signal.

8. The assembly of claim 7, wherein the current sample is a voltage and the reference is ½ a least significant bit (LSB) voltage.

9. An electrical circuit for converting analog electrical signals to digital signals in a digital sensor assembly, the integrated circuit comprising:
a successive-approximation (SA) quantizer electrically connectable to a transduction element of the digital sensor assembly, the SA quantizer including:
a comparator having inputs coupled to an output of a switched-capacitive digital-to-analog converter (SC-DAC);
SA logic coupled to an output of the comparator and to the SC-DAC; and
a successive-approximation register (SAR) coupled to the SA logic and to the SC-DAC;
the SA quantizer configured to output a digital code, stored in the SAR for a prior sample period when the SA quantizer is coupled to the transduction element, for a current sample period when a reuse condition is satisfied.

10. The electrical circuit of claim 9, wherein the SA quantizer is configured to:
search for a new digital code for the current sample period when the reuse condition is not satisfied; and
not search for the new digital code for the current sample period when the reuse condition is satisfied.

11. The electrical circuit of claim 10, wherein the SA quantizer is configured to search for the new digital code by searching quantization levels using the SA logic, the SC-DAC, and the comparator of the SA quantizer.

12. The electrical circuit of claim 9 in combination with a micro electro mechanical systems (MEMS) transduction element configured to sense acoustic signals.

13. The electrical circuit of claim 9, wherein the SC-ADC is a delta-sigma ADC.

14. A method in a digital sensor assembly, the method comprising:
obtaining a current sample of an analog electrical signal generated by a transduction element of the sensor assembly;
comparing the current sample with an analog signal output by a switched-capacitive digital-to-analog converter (SC-DAC) for a digital code stored in a successive-approximation register (SAR) of a SA quantizer for a prior sample period;
reusing a digital code, stored in the SAR for the prior sample period, for a current sample period when a reuse condition is satisfied,
wherein the digital code generated for the prior sample period represents the current sample.

15. The method of claim 14 further comprising bypassing a search operation performed by the SA quantizer for a new digital code for the current sample period when the digital code generated for a prior sample period is reused.

16. The method of claim 15 further comprising generating the analog electrical signal in response to detecting an acoustic signal using the transduction element.

17. The method of claim 14 further comprising:
comparing a difference between the current sample and the analog signal output by the SC-DAC to a reference;
searching for a new digital code for the current sample period when the difference is greater than the reference; and
reusing the digital code generated for the prior sample period and not searching for the new digital code for the current sample period when the difference is less than the reference.

18. The method of claim 17, wherein searching for the new digital code comprises searching quantization levels using SA logic, the SC-DAC and a comparator of the SA quantizer.

19. The method of claim 18 further comprising generating the analog electrical signal in response to detecting an acoustic signal using a micro-electro mechanical systems (MEMS) transduction element of the sensor assembly, wherein the analog electrical signal is representative of the acoustic signal.

20. The method of claim 19, wherein comparing the difference to the reference comprises comparing a sampled voltage of the analog electrical signal to ½ a least significant bit (LSB) voltage.

* * * * *